United States Patent
Tokeshi et al.

(10) Patent No.: US 11,397,039 B2
(45) Date of Patent: Jul. 26, 2022

(54) COOLING UNIT

(71) Applicant: NIDEC CORPORATION, Kyoto (JP)

(72) Inventors: Toshihiko Tokeshi, Kyoto (JP);
Takehito Tamaoka, Kyoto (JP);
Nobuya Nakae, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 39 days.

(21) Appl. No.: 16/595,510

(22) Filed: Oct. 8, 2019

(65) Prior Publication Data

US 2020/0124337 A1 Apr. 23, 2020

(30) Foreign Application Priority Data

Oct. 18, 2018 (JP) .............................. JP2018-196900

(51) Int. Cl.
*F25D 17/02* (2006.01)
*F25D 31/00* (2006.01)

(52) U.S. Cl.
CPC ............. *F25D 17/02* (2013.01); *F25D 31/00* (2013.01)

(58) Field of Classification Search
CPC ................................ F25D 17/02; F25D 31/001
See application file for complete search history.

(56) References Cited

U.S. PATENT DOCUMENTS

| | | | |
|---|---|---|---|
| 10,271,457 B2* | 4/2019 | Liu | F24F 3/08 |
| 10,309,712 B2* | 6/2019 | Müller | F25B 39/02 |
| 2003/0151895 A1* | 8/2003 | Zuo | H01L 23/433 |
| | | | 361/699 |
| 2004/0105232 A1* | 6/2004 | Ito | F04D 29/588 |
| | | | 361/679.53 |
| 2005/0069432 A1* | 3/2005 | Tomioka | G06F 1/203 |
| | | | 417/423.1 |
| 2005/0083656 A1* | 4/2005 | Hamman | F28D 15/00 |
| | | | 361/699 |
| 2011/0052248 A1* | 3/2011 | Nishimura | G03G 21/20 |
| | | | 165/104.33 |
| 2012/0061058 A1 | 3/2012 | Eriksen | |
| 2014/0102672 A1* | 4/2014 | Campbell | H05K 7/20836 |
| | | | 165/104.19 |
| 2015/0296659 A1* | 10/2015 | Desiano | H05K 7/20263 |
| | | | 165/80.4 |

* cited by examiner

*Primary Examiner* — Filip Zec
(74) *Attorney, Agent, or Firm* — Keating & Bennett

(57) ABSTRACT

A cooling unit has a cold plate extending in a horizontal direction, and a tank and a pump disposed above the cold plate in a first direction perpendicular to the horizontal direction. The tank has a tank chamber which stores a refrigerant. The pump has a pump chamber in which a rotating body that transfers the refrigerant is accommodated, and an upper end of the tank chamber in the first direction is positioned at an upper side than an upper end of the pump chamber in the first direction.

7 Claims, 2 Drawing Sheets

COOLING UNIT

CROSS REFERENCE TO RELATED APPLICATIONS

This application claims the priority benefit of Japanese Patent Application No. 2018-196900, filed on Oct. 18, 2018. The entirety of the above-mentioned patent application is hereby incorporated by reference herein and made a part of this specification.

BACKGROUND

Technical Field

The present disclosure relates to a cooling unit.

Description of Related Art

A conventional cooling unit includes a pump having a rotating body that transfers a refrigerant and a reservoir (for example, Specification of U.S. Patent Application Publication No. 2012/061058).

However, in the conventional cooling unit, there is a case in which an amount of the refrigerant decreases as the cooling unit is used and air enters a pump chamber. When air enters the pump chamber and the rotating body rotates in a space with little refrigerant, there is a likelihood that a circulating amount of the refrigerant will decrease and thus a cooling efficiency of the cooling unit will deteriorate.

It is desirable to suppress air from entering a pump chamber and inhibit deterioration in cooling efficiency of a cooling unit even when an amount of a refrigerant in the cooling unit decreases.

SUMMARY

According to one embodiment of the disclosure, a cooling unit is provided, which may have a cold plate extending in a horizontal direction, and a tank and a pump disposed above the cold plate in a first direction perpendicular to the horizontal direction, in which the tank has a tank chamber that stores a refrigerant, the pump has a pump chamber in which a rotating body that transfers the refrigerant is accommodated, and an upper end of the tank chamber in the first direction is positioned at an upper side than an upper end of the pump chamber in the first direction.

According to the exemplary present disclosure, deterioration in cooling efficiency of the cooling unit can be prevented.

DESCRIPTION OF THE EMBODIMENTS

Hereinafter, exemplary embodiments of the present disclosure will be described with reference to the drawings. Also, in the present application, a vertical direction is defined such that a direction in which a tank 11 is disposed relative to a cold plate 10 is referred to as "upward," and a direction opposite to the direction in which the tank 11 is disposed is referred to as "downward." In addition, in the present application, a direction in which the tank 11 is disposed relative to the cold plate 10 is referred to as a "first direction." However, the above is just a definition of the vertical and horizontal directions for convenience of explanation and does not limit the orientation of the cooling unit 1 according to the present disclosure when the cooling unit 1 is manufactured and used.

Further, in the present application, a "parallel direction" includes a substantially parallel direction. Also, in the present application, an "orthogonal direction" includes a substantially orthogonal direction.

First Embodiment

Figure 1:
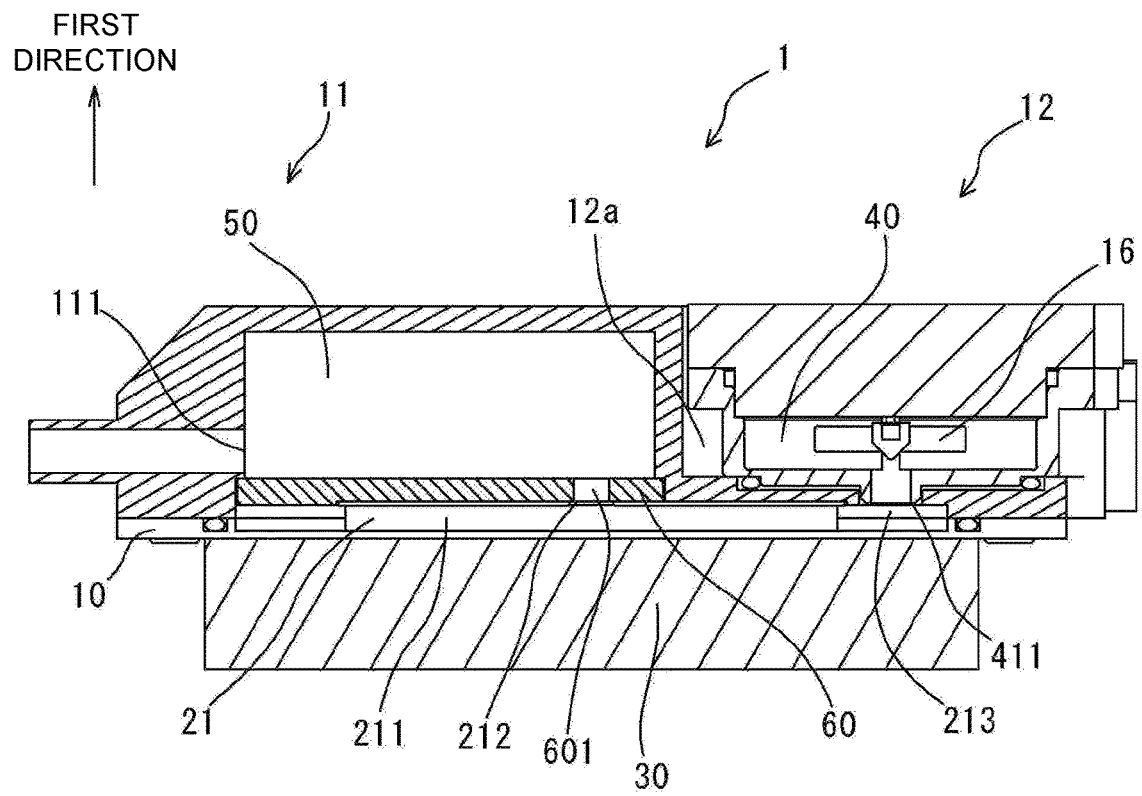
FIG. 1 is a cross-sectional view of a cooling unit according to a first exemplary embodiment of the present disclosure.

A cooling unit 1 according to an exemplary embodiment of the present disclosure will be described. FIG. 1 is a cross-sectional view of the cooling unit according to a first exemplary embodiment of the present disclosure.

The cooling unit 1 includes a cold plate 10, a tank 11, and a pump 12. The tank 11 and the pump 12 are disposed above the cold plate 10 in the first direction.

<Cold Plate>

The cold plate 10 is made of a metal having high thermal conductivity such as copper or aluminum and has a rectangular plate shape extending in the horizontal direction when viewed from above. Also, although the cold plate 10 of the present embodiment has a rectangular shape in a top view, it is not limited thereto and may have, for example, a polygonal shape having a plurality of corners in a top view, or a circular shape. A heat generating component 30 is disposed on a lower surface of the cold plate 10.

The cold plate 10 has a first refrigerant channel 21 through which a refrigerant flows. The first refrigerant channel 21 is a space in the cold plate 10. A plurality of blades 211 disposed parallel to each other are provided inside the first refrigerant channel 21. In addition, the first refrigerant channel 21 is provided with an inlet 212 and an outlet 213. The refrigerant that has flowed into the first refrigerant channel 21 via the inlet 212 is discharged from the first refrigerant channel 21 via the outlet 213.

The refrigerant in the present embodiment is a liquid, and for example, an antifreeze solution such as an ethylene glycol aqueous solution or a propylene glycol aqueous solution, pure water or the like is used.

<Pump>

The cooling unit 1 has the pump 12. The pump 12 in the present embodiment is a centrifugal pump and has a pump chamber 40 through which the refrigerant flows. The pump chamber 40 is disposed below a motor (not shown), which will be described later, in the first direction. An impeller 16 (a rotating body) capable of transferring the refrigerant is disposed in the pump chamber 40.

The pump chamber 40 has a suction port 411 and a discharge port (not shown). The suction port 411 is provided at a lower end of the pump chamber 40 in the first direction, and vertically coincides with the outlet 212 of the cold plate 10 in the first direction and communicates therewith. The discharge port (not shown) communicates with a through hole 111 of the tank 11, which will be described later. In the present embodiment, the discharge port and the through hole 111 of the tank 11 are connected via a connection pipe 80 and a radiator 70.

The impeller 16 of the pump 12 is supported to be rotatable about a central axis extending in the first direction and is connected to a rotational shaft of the motor. When the impeller 16 is rotated by driving of the motor, the refrigerant that has flowed into the pump chamber 40 through the suction port 411 is discharged from the discharge port.

<Tank>

The cooling unit 1 has the tank 11. The tank 11 has a substantially rectangular parallelepiped shape and is made of a resin material. It can be formed more easily than in a case where the tank 11 is made of a metal. Also, it is possible to prevent surfaces of the tank 11 from rusting even in an environment where moisture or the like adheres thereto. The tank 11 includes the tank chamber 50 in which the refrigerant that has flowed thereinto is stored. The tank chamber 50 is a recessed portion formed by the tank 11 being recessed upward in the first direction. The tank chamber 50 has a substantially rectangular parallelepiped shape. Since the cooling unit 1 has the tank chamber 50, an amount of the refrigerant circulating in the cooling unit 1 can be increased. By increasing the amount of the refrigerant circulating in the cooling unit 1, it is possible to inhibit deterioration in cooling efficiency of the cooling unit 1.

The tank 11 has the through hole 111. In the present embodiment, the through hole 111 extends in a direction perpendicular to the first direction. The through hole 111 communicates with the discharge port of the pump 12. In the present embodiment, the through hole 111 and the discharge port are connected via the connection pipe 80 and a pipe channel 721 of the radiator 70, which will be described later.

In the present embodiment, the pump 12 and the tank 11 are disposed adjacent to each other. Specifically, the tank 12 has a cutout portion 12a formed by cutting out a side surface thereof, and at least a part of the pump 12 is disposed in the cutout portion 12a. By disposing the pump 12 in the cutout portion 12a, the cooling unit 1 can be reduced in size.

The cooling unit 1 further has a partition portion 60. The partition portion 60 extends in the horizontal direction and is disposed between the tank 11 and the cold plate 10 in the first direction. Specifically, the partition portion 60 closes an opening of the recessed portion that forms the tank chamber 50. The tank chamber 50 is formed by an inner surface of the recessed portion of the tank 11 and an upper surface of the partition portion 60 in the first direction. The partition portion 60 has a through portion 601 vertically penetrating therethrough in the first direction. The through portion 601 communicates with the tank chamber 50, and a lower end of the through portion 601 in the first direction communicates with the inlet 212. Also, in the present embodiment, the through portion 601 is the inlet 212. The refrigerant discharged from the pump chamber 40 flows into the through portion 601 through the tank chamber 50. The refrigerant that has passed through the through portion 601 flows into the first channel 21. The partition portion 60 regulates a flow of the refrigerant flowing into the tank chamber 50 and allows the refrigerant to flow to a predetermined position on the cold plate 10 via the through portion 601.

The cooling unit further has the radiator 70. The radiator 70 has a plurality of fins 71 and pipes 72 for cooling. The fin 71 is formed in a flat plate shape and stands upward in the first direction. The plurality of fins 71 are disposed parallel to each other with uniform intervals therebetween. The pipes 72 are inserted into holes (not shown) of the plurality of fins 71 and are fixed to the plurality of fins 71 by welding. At this time, a direction in which the pipes 72 extend and a direction in which the fins 71 extend are orthogonal to each other. The pipe 72 is hollow inside and forms a pipe channel 721 through which the refrigerant passes. One end of the pipe channel 721 communicates with the through hole 111 directly or indirectly. As will be described later, the one end of the pipe channel 721 may communicate with the through hole 111 via the connection pipe 80, for example. Also, a plurality of pipe channel 721 may be disposed in the first direction.

The cooling unit 1 further has the connection pipe 80. The connection pipe 80 is hollow inside and is made of an elastic material such as rubber, for example. The refrigerant flows inside the connection pipe 80. The connection pipe 80 connects the pump 12 and the radiator 70. Specifically, one end of the connection pipe 80 communicates with one end of the pipe channel 721. The other end of the connection pipe 80 communicates with the discharge port of the pump 12. The connection pipe 80 connects the tank 11 and the radiator 70. Specifically, the other end of the connection pipe 80 communicates with the other end of the pipe channel 721. Also, one end of the connection pipe 80 communicates with the through hole 111.

(Operations of Cooling Unit)

The pump 12 is driven by bringing the heat generating component 30 to be cooled, such as a CPU, into contact with the lower surface of the cold plate 10. In this way, the refrigerant circulates in the order of the first refrigerant channel 21, the pump chamber 40, the pipe channel 721, and the tank chamber 50. Heat generated by the heat generating component 30 is transmitted to the cold plate 10. The heat transmitted to the cold plate 10 is transmitted to the refrigerant flowing through the first refrigerant channel 21. The refrigerant is dissipated through the radiator 70, and a temperature rise of the heat generating component 30 can be inhibited.

An upper end of the tank chamber 50 in the first direction is positioned at an upper side than an upper end of the pump chamber 40 in the first direction.

The pump chamber 40 is preferably filled with the refrigerant. The air that has entered the cooling unit 1 circulates in the cooling unit 1 together with the refrigerant. Specifically, the air that has entered the pump chamber 40 is pushed out by the impeller 16 and enters the tank chamber 50 of the tank 11 through the pipe channel 721 of the radiator 70. The air that has entered the tank chamber 50 rises to the upper end of the tank chamber 50 in the first direction. The air rising to the upper end of the tank chamber 50 in the first direction stays at the upper end of the tank chamber 50 in the first direction and does not flow to the pump chamber 40 side. Accordingly, by positioning the upper end of the tank chamber 50 in the first direction at an upper side than the upper end of the pump chamber 40 in the first direction, air can be retained at the upper end of the tank chamber 50 in the first direction and thus air can be inhibited from flowing into the pump chamber 40. Therefore, it is possible to inhibit deterioration in cooling efficiency of the cooling unit 1.

Further, as described above, the through portion 601 allowing the refrigerant that has entered the tank chamber 50 to flow to the cold plate 10 is preferably provided below the tank chamber 50. By providing it at the lower end in the first direction, air that has entered the tank chamber 50 can be made less likely to flow to the pump chamber 40 side.

In the present embodiment, although the tank chamber 50 has been described as a rectangular parallelepiped body, the present disclosure is not limited thereto.

Second Embodiment

Figure 2:
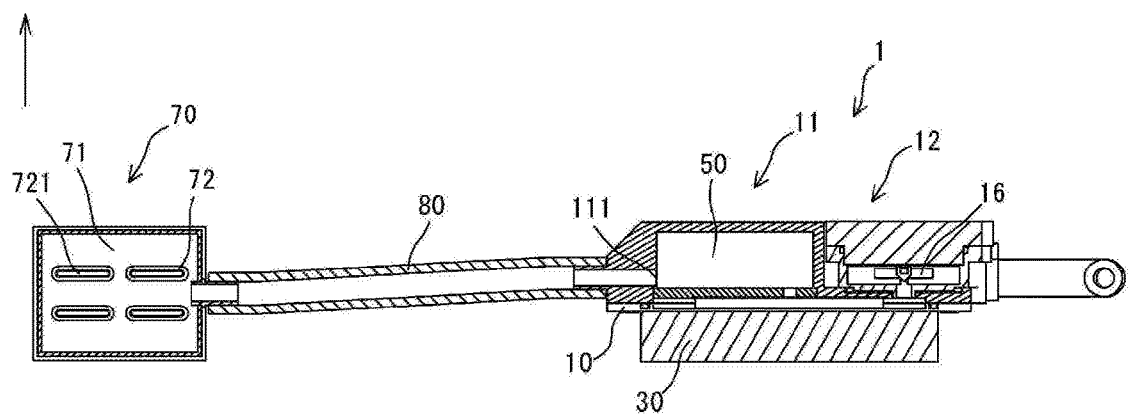
FIG. 2 is a cross-sectional view of a cooling unit according to a second exemplary embodiment of the present disclosure.

Next, a second embodiment will be described. FIG. 2 is a cross-sectional view showing the cooling unit 1 of the second embodiment. For convenience of explanation, portions the same as those in the first embodiment described above are denoted by the same reference signs.

The upper end of the tank chamber 50 in the first direction is positioned at an upper side than the upper end of the pipe channel 721 of the radiator 70 in the first direction. In the first embodiment, it has been described that air desirably does not stay in the pump chamber 40, but it is also desirable that air does not stay in the pipe channel 721. Specifically, the air that has entered the pipe channel 721 enters the tank chamber 50 through the through hole 111. The air that has entered the tank chamber 50 rises to the upper end of the tank chamber 50 in the first direction. The air rising to the upper end of the tank chamber 50 in the first direction stays at the upper end of the tank chamber 50 in the first direction and does not flow to the pump chamber 40 side. That is, the air that has entered the tank chamber 50 does not flow into the pipe channel 721 of the radiator 70. Therefore, by positioning the upper end of the tank chamber 50 in the first direction at an upper side than the upper end of the pipe channel 721 of the radiator 70 in the first direction, air can be prevented from staying in the pipe channel 721 and thus it is possible to prevent deterioration in cooling efficiency of the radiator 70.

Third Embodiment

Figure 3:
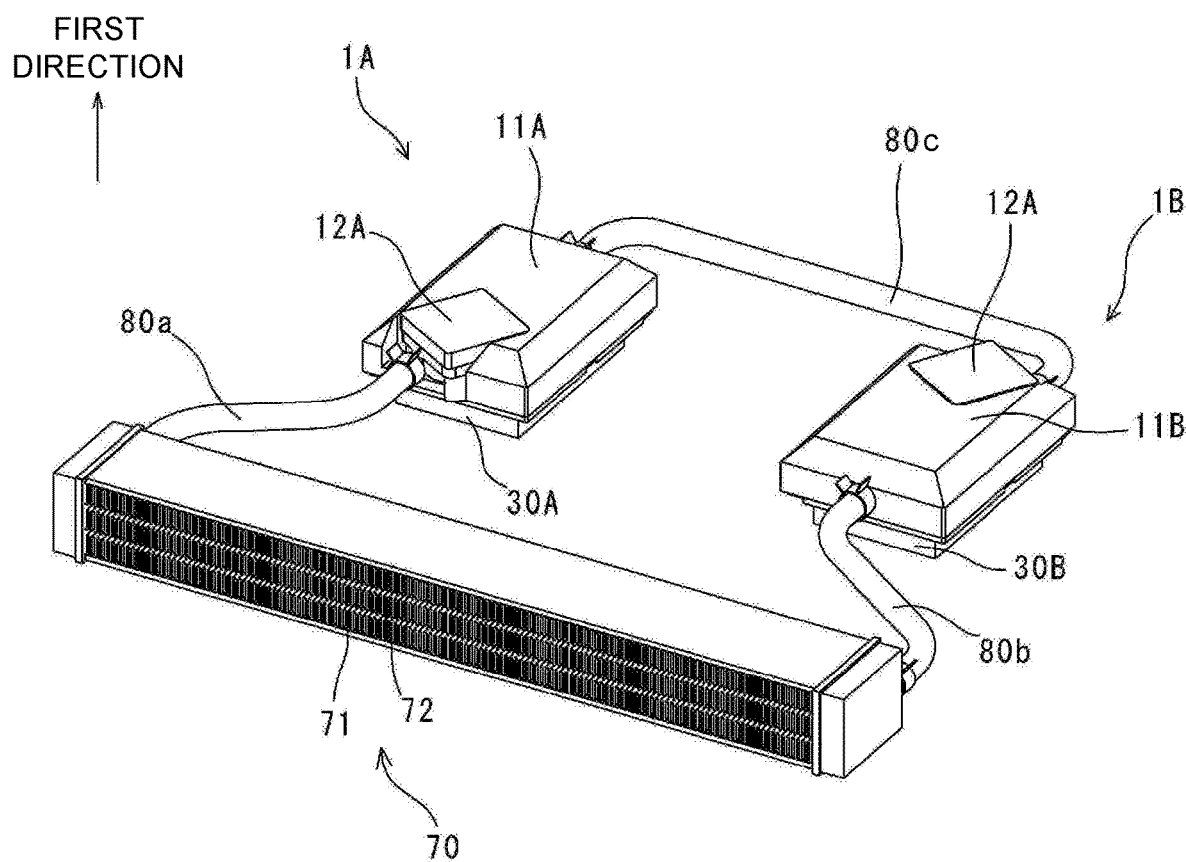
FIG. 3 is a perspective view of a cooling unit according to a third exemplary embodiment of the present disclosure.

Next, a third embodiment will be described. FIG. 3 is a perspective view showing a cooling unit 1A and a cooling unit 1B of the third embodiment. For convenience of explanation, portions the same as those in the first embodiment described above are denoted by the same reference signs.

A plurality of cooling units may be provided. The cooling units 1A and 1B have the same configuration and the same size. The cooling units 1A and 1B are disposed parallel to each other in the horizontal direction. The cooling units 1A and 1B are connected in series via connection pipes (80a, 80b, and 80c) and the radiator 70. Specifically, a discharge port A of the pump 12A is connected to one end of the pipe channel 721 of the radiator 70 through the connection pipe 80a. The other end of the pipe channel 721 is connected to the through hole 111B of the tank 11B through the connection pipe 80b. A discharge port B of the cooling unit 1B is connected to the through hole 111A through the connection pipe 80c. Therefore, the refrigerant circulates in the cooling unit 1A and the cooling unit 1B. By providing the plurality of cooling units, a plurality of heat generating components (30A and 30B) can be cooled while inhibiting deterioration in cooling efficiency of the pump 12A and the pump 12B.

(Other)

It should be understood that the above embodiments are merely examples of the present disclosure. Configurations of the embodiments may be appropriately changed without departing from the technical idea of the present disclosure. Also, the embodiments may be implemented in combination within a possible range.

In the above embodiments, a centrifugal pump is used, but a diaphragm pump, a cascade pump, or the like may be used.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A cooling unit comprising:
   a cold plate extending in a horizontal direction;
   a tank above the cold plate in a first direction perpendicular to the horizontal direction, the tank defines a tank chamber that stores a refrigerant and the tank includes an outer tank surface and an inner tank surface;
   a pump above the cold plate in the first direction, the pump defines a pump chamber and the pump includes an outer pump surface and an inner pump surface; wherein
   a portion of the tank is overlapped by the cold plate when viewed along the first direction;
   a portion of the pump is overlapped by the cod plate when viewed along the first direction;
   the pump chamber is spaced away from and outside of the tank chamber;
   the pump chamber accommodates a rotating body that transfers the refrigerant;
   a portion of the outer tank surface and a portion of the outer pump surface are opposed to one another in the horizontal direction; and
   an upper end of the tank chamber in the first direction is positioned higher than an upper end of the pump chamber in the first direction.

2. The cooling unit according to claim 1, further comprising a radiator,
   wherein the radiator includes a pipe channel through which the refrigerant flows, and
   the upper end of the tank chamber in the first direction is positioned higher than an upper end of the pipe channel in the first direction.

3. The cooling unit according to claim 1, wherein
   the cold plate includes a refrigerant channel; and
   a plurality of blades are parallel or substantially parallel to each other and inside the refrigerant channel.

4. The cooling unit according to claim 3, further comprising a partition portion; wherein
   the partition portion extends in the horizontal direction;
   the partition portion is between the tank chamber and the refrigerant channel in the first direction;
   the partition portion includes a through portion penetrating therethrough in the first direction; and
   the through portion communicates with the tank chamber and the refrigerant channel.

5. The cooling unit according to claim 4, wherein
   the pump chamber includes a suction port at a lower end of the pump chamber in the first direction; and
   the suction port communicates with the pump chamber and the refrigerant channel.

6. The cooling unit according to claim 5, wherein the refrigerant flows from the tank chamber to the refrigerant channel through the through portion, and flows from the refrigerant channel to the pump chamber through the suction port.

7. The cooling unit according to claim 1, wherein
   a side portion in the horizontal direction of the tank chamber includes a through hole; and
   the through hole communicates with a connection pipe.

* * * * *